United States Patent
Miyakawa et al.

(10) Patent No.: US 7,542,325 B2
(45) Date of Patent: Jun. 2, 2009

(54) FERROELECTRIC MEMORY

(75) Inventors: Tadashi Miyakawa, Yokohama (JP);
Daisaburo Takashima, Yokohama (JP)

(73) Assignee: Kabushiki Kaisha Toshiba, Minato-ku, Tokyo (JP)

( * ) Notice: Subject to any disclaimer, the term of this patent is extended or adjusted under 35 U.S.C. 154(b) by 16 days.

(21) Appl. No.: 11/873,764

(22) Filed: Oct. 17, 2007

(65) Prior Publication Data
US 2008/0089109 A1 Apr. 17, 2008

(30) Foreign Application Priority Data
Oct. 17, 2006 (JP) .............................. 2006-282589

(51) Int. Cl.
*G11C 11/22* (2006.01)
*G11C 11/24* (2006.01)
(52) U.S. Cl. ...................... 365/145; 365/149
(58) Field of Classification Search ................ 365/145, 365/149
See application file for complete search history.

(56) References Cited

U.S. PATENT DOCUMENTS

| | | | |
|---|---|---|---|
| 6,151,242 A * | 11/2000 | Takashima | 365/145 |
| 6,697,279 B2 * | 2/2004 | Schneider et al. | 365/145 |
| 6,934,177 B2 * | 8/2005 | Takashima | 365/145 |
| 6,990,007 B2 * | 1/2006 | Shiratake | 365/145 |
| 7,046,541 B2 * | 5/2006 | Ogiwara et al. | 365/145 |
| 7,064,972 B2 * | 6/2006 | Takashima | 365/145 |
| 7,099,178 B2 * | 8/2006 | Shiratake | 365/145 |
| 7,154,766 B2 * | 12/2006 | Oikawa et al. | 365/145 |
| 2005/0232035 A1 | 10/2005 | Miyakawa et al. | |

FOREIGN PATENT DOCUMENTS

JP 2001-250376 9/2001

* cited by examiner

*Primary Examiner*—Trong Phan
(74) *Attorney, Agent, or Firm*—Banner & Witcoff, Ltd

(57) ABSTRACT

A ferroelectric memory comprises a memory cell block of plural serially connected memory cells each including a cell transistor and a ferroelectric capacitor connected in parallel therewith. And the ferroelectric memory comprises a cell transistor resistance measuring circuit, a word line voltage controller, and a word line voltage generator. The cell transistor resistance measuring circuit measures a resistance of the cell transistor. The word line voltage controller controls a word line voltage applied to a gate of the cell transistor based on the resistance of the cell transistor. The word line voltage generator generates the word line voltage.

16 Claims, 7 Drawing Sheets

FERROELECTRIC MEMORY

CROSS-REFERENCE TO RELATED APPLICATION

This application is based upon and claims the benefit of priority from the prior Japanese Patent Application No. 2006-282589, filed on Oct. 17, 2006, the entire contents of which are incorporated herein by reference.

BACKGROUND OF THE INVENTION

1. Field of the Invention

The present invention relates to a ferroelectric memory that uses a ferroelectric capacitor and a transistor to configure a memory cell.

2. Description of the Related Art

Storage devices using a ferroelectric capacitor as a storage medium, (ferroelectric memories), have been developed and practically used (see JP 2001-250376A). The ferroelectric memory is non-volatile and thus causes no loss of the stored content even after power-off. In addition, if it has a sufficiently thin film thickness, the inversion speed of spontaneous polarization is higher and enables fast write/read accordingly. These excellent characteristics are present in the ferroelectric memory. The ferroelectric memory is suitable for achievement of mass storage because one-bit memory cell can be composed of one transistor and one ferroelectric capacitor.

In recent years, among the ferroelectric memories, attention has been focused on a ferroelectric memory of the TC-parallel, unit-serial connection type. The ferroelectric memory of the TC parallel unit serial connection type includes a ferroelectric capacitor having a bottom electrode and a top electrode connected between a source and a drain of a cell transistor. The cell transistor and the ferroelectric capacitor form a unit cell (memory cell) and such unit cells are serially connected.

On information read from a specific memory cell (selected memory cell), the ferroelectric memory of the TC parallel unit serial connection type applies a potential to the capacitor in the selected memory cell via cell transistors in non-selected memory cells serially connected. The voltage on the capacitor in the selected memory cell is transferred to a bit line to read the state of storage in the memory cell.

For example, referring to a memory cell train located between BL and PL in FIG. 9 of Patent Document 1, memory cells, each including a ferroelectric capacitor and a cell transistor connected in parallel therewith, are serially connected. When a memory cell M0 is selected, the potential on the plate line PL to be applied to the ferroelectric capacitor in the selected cell or memory cell M0 is transferred through cell transistors in non-selected cells or memory cells MC1-MC7. In a word, the rise of the voltage difference across the both ends of the memory cell M0 is susceptible to the resistance of the cell transistors in the non-selected cells.

Thus, a difference in resistance of the cell transistors causes a difference in time required for the voltage difference across the both ends of the selected cell or memory cell to reach a certain level. A conventional FeRAM may cause a malfunction because a sense operation starts before the voltage difference reaches a certain level due to the difference in resistance of the cell transistors.

The cell transistors have respective shapes disturbed on production and uneven resistances. In a word, the time required for a cell node in the selected memory cell to reach a certain level can not be made constant. Therefore, the configuration of the cell transistors as above may cause a malfunction because a sense operation is executed before the cell node reaches a certain level. The unevenness among the resistances of the cell transistors causes a lowered yield in production of the ferroelectric memory of the TC parallel unit serial connection type.

SUMMARY OF THE INVENTION

In an aspect the present invention provides a ferroelectric memory, comprising: a memory cell block of plural serially connected memory cells each including a cell transistor and a ferroelectric capacitor connected in parallel therewith; a cell transistor resistance measuring circuit configured to measure a resistance of the cell transistor; a word line voltage controller configured to control a word line voltage applied to a gate of the cell transistor based on the resistance of the cell transistor; and a word line voltage generator configured to generate the word line voltage.

DETAILED DESCRIPTION OF THE EMBODIMENTS

The preferred embodiments of the present invention will now be described below with reference to the drawings.

Figure 11:
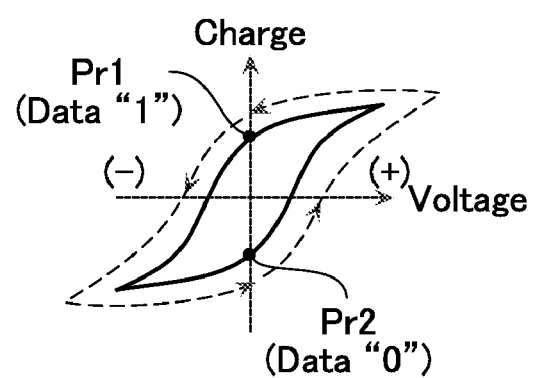
FIG. 11 is a characteristic diagram showing operation of the FeRAM.

Referring first to FIG. 11, the principle of a ferroelectric memory (FeRAM) is described. When a voltage for read is applied to a ferroelectric capacitor in the FeRAM, surely one of data "0" and "1" associates with an inversion of spontaneous polarization. Therefore, rewrite is required after read to invert the inverted spontaneous polarization again using the read data. As shown in FIG. 11, spontaneous polarization Pr1, Pr2 in the hysteresis characteristic of the ferroelectric capacitor may correspond to the state of storage of data "1", "0". An application of a voltage positive in FIG. 11 (such as a plate voltage) to the ferroelectric capacitor generates a larger amount of signal charge for "0" data as shown with the dashed line. In this case, a restoration of the voltage results in the state of "1" data with spontaneous polarization inverted. Namely, destructive read is executed. The "1" data has a smaller amount of signal charge and causes no inversion of polarization. Thereafter, an application of a negative voltage to the ferroelectric capacitor results in rewrite of "0" data as shown with the dashed line.

Referring now to FIGS. 1-10, an embodiment of the present invention is described.

Figure 1:
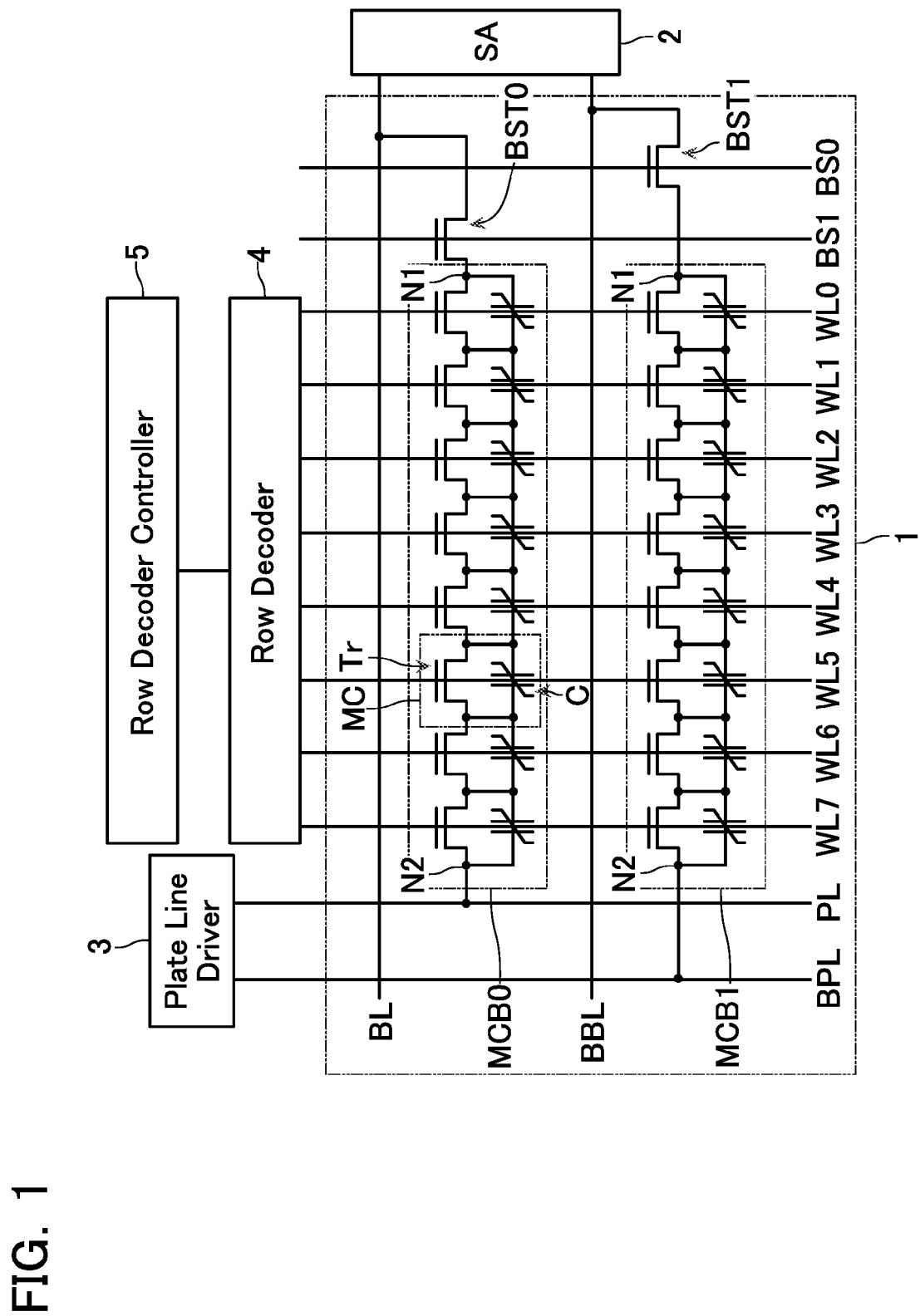
FIG. 1 is a block diagram of a FeRAM according to an embodiment of the present invention.

FIG. 1 is a block diagram of a FeRAM according to the embodiment of the present invention. A memory cell array 1 comprises a memory cell MC including a ferroelectric capacitor C and a cell transistor Tr as described above. In the memory cell MC the ferroelectric capacitor C is connected in parallel with the cell transistor Tr. Such memory cells MC are serially connected eight in the shown example to form a cell block MCB0, MCB1. Each cell block MCB0, MCB1 configures a ferroelectric memory of the TC parallel unit serial connection type. The figure shows two cell blocks MCB0 and MCB1 connected to a pair of bit lines BL and BEL.

The cell block MCB0, MCB1 has one end N1 connected via a block selection transistor BST0, BST1 to the bit line BL, BBL and the other end N2 connected to the plate line PL, BPL. In each cell block MCB0, MCB1, the cell transistor Tr has a gate connected to a word line WL0-WL7. The bit lines BL and BBL are connected to a sense amp(SA)2 operative to sense/amplify read data. The plate lines PL and BPL are connected to a plate line driver 3.

The FeRAM also comprises a row decoder 4 operative to selectively drive the word line WL0-WL7 in the memory cell array 1, and a row decoder controller 5 operative to control the row decoder 4. The row decoder controller 5 measures the resistance of the cell transistors Tr and controls the word line voltage applied to the transistor Tr in accordance with the measurement result. Namely, the row decoder controller 5 contributes to a retained sense margin even if the resistance of the cell transistors Tr greatly varies.

Figure 2:
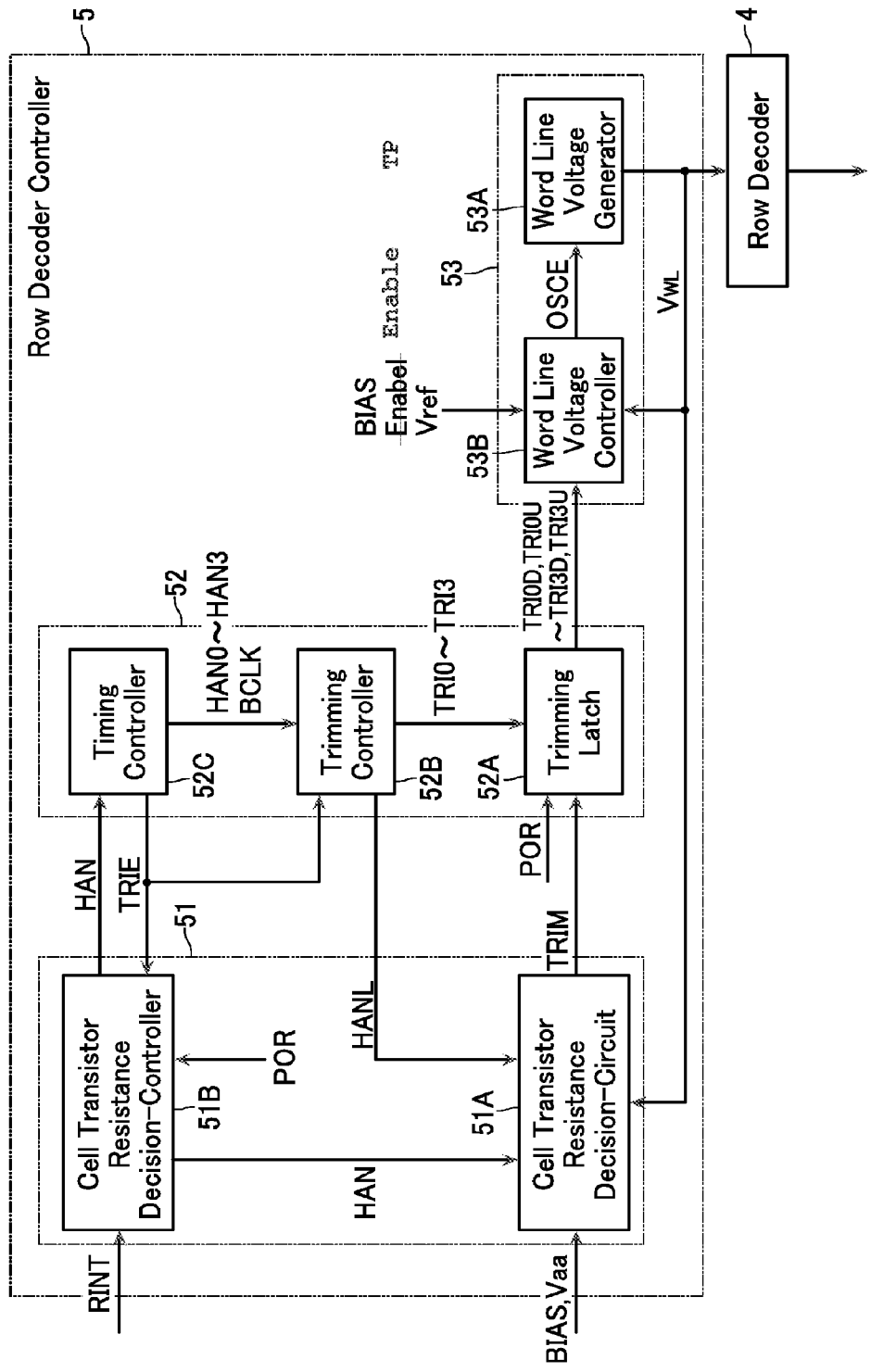
FIG. 2 is a brief block diagram of a row decoder controller in the FeRAM according to the embodiment of the present invention.

Referring next to FIG. 2, the row decoder controller 5 is described in detail. FIG. 2 is a brief block diagram of the row decoder controller 5. As shown in FIG. 2, the row decoder controller 5 mainly includes a cell transistor evaluator 51, a voltage adjuster 52, and a voltage supplier 53.

The cell transistor evaluator 51 evaluates the characteristic of the cell transistor Tr integrated in the memory cell MC. The voltage adjuster 52 adjusts the voltage applied to the cell transistor Tr from the power supply 53 based on the evaluated characteristic of the cell transistor Tr. The voltage supplier 53 generates the voltage adjusted at the voltage adjuster 52 and supplies it to the row decoder 4.

The cell transistor evaluator 51 includes a cell transistor resistance decision-circuit 51A and a cell transistor resistance decision-controller 51B.

The cell transistor resistance decision-circuit 51A measures the resistance of the cell transistors Tr contained in the memory cell MC. The cell transistor resistance decision-controller 51B controls the cell transistor resistance decision-circuit 51A to start decision.

The voltage adjuster 52 includes a trimming latch 52A, a trimming controller 52B, and a timing controller 52C.

The trimming latch 52A latches the decision resulted from the cell transistor resistance decision-circuit 51A to control a word line voltage controller 53B later described. The trimming controller 52B controls the trimming latch 52A. The timing controller 52C controls the timing of measuring the resistance of the cell transistors Tr and the timing of trimming.

The voltage supplier 53 includes a word line voltage generator 53A and a word line voltage controller 53B.

The word line voltage generator 53A generates a voltage applied to the word line WL0-WL7. The word line voltage controller 53B controls the word line voltage generator 53A based on the measured resistance of the cell transistors Tr.

Figure 3:
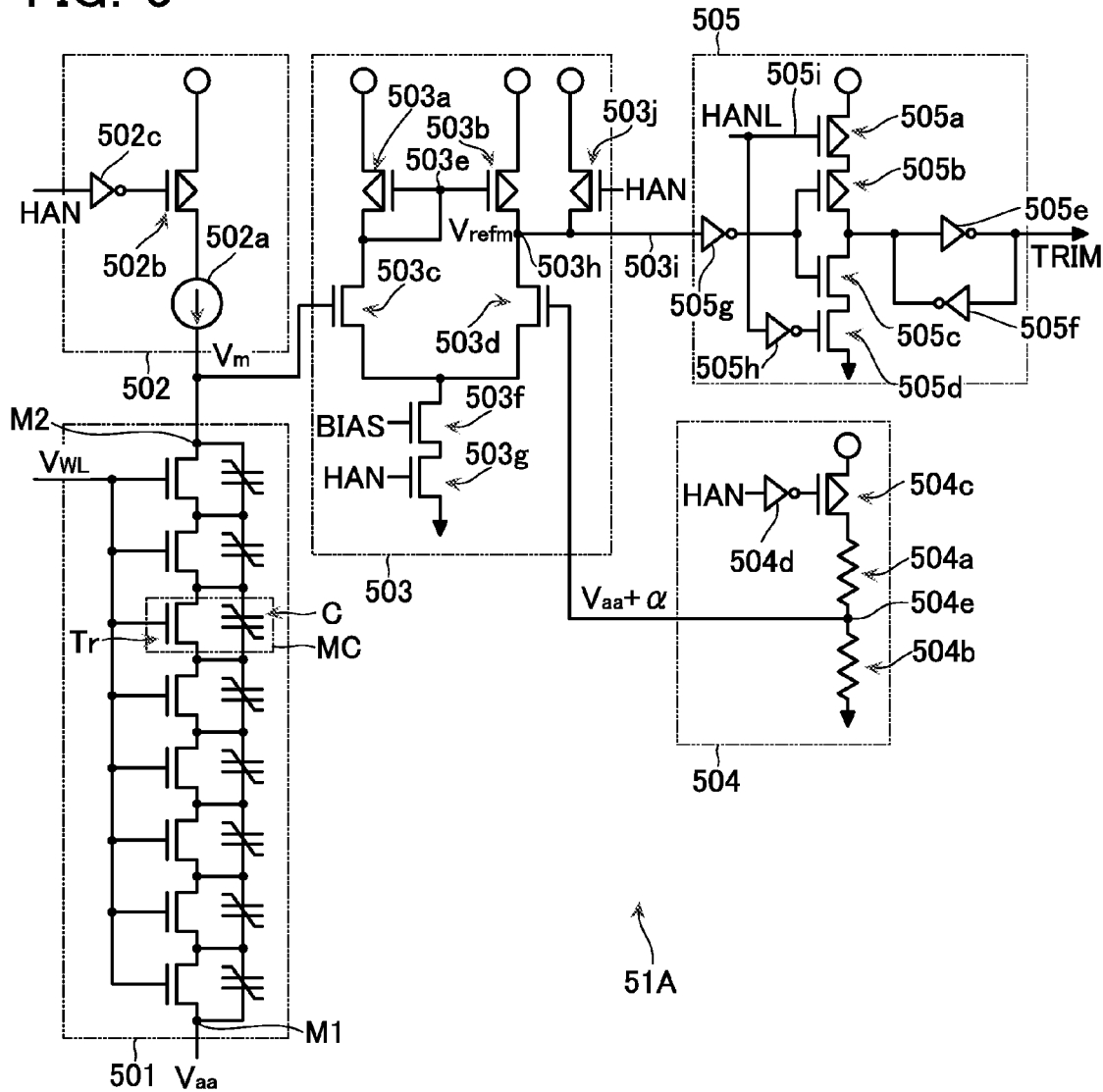
FIG. 3 is a brief block diagram of a cell transistor resistance decision-circuit 51A in the FeRAM according to the embodiment of the present invention.

Referring next to FIG. 3, the circuitry of the cell transistor resistance decision-circuit 51A is described.

The cell transistor resistance decision-circuit 51A includes a dummy cell block 501, a constant current source unit 502, a differential amp 503, a reference voltage circuit 504, and a latch 505 as shown in FIG. 3.

The dummy cell block 501 has the same configuration as the cell block MCB0, MCB1 in the memory cell array 1. The constant current source unit 502 provides a constant current. The differential amp 503 amplifies a voltage difference between two input signals. The reference voltage circuit 504 generates a reference voltage.

These elements 501-505 are connected to each other as described below. Namely, the dummy cell block 501 has one end M2 connected to the constant current source unit 502. The differential amp 503 is provided such that one input terminal thereof is supplied with the potential $V_m$ on the end M2. The other input terminal of the differential amp 503 is supplied with the reference voltage, $V_{aa}+\alpha$, output from the reference voltage circuit 504. The output terminal of the differential amp 503 is provided with the latch 505.

The dummy cell block 501 has the same configuration of the TC parallel unit serial connection type as the cell block MCB0, MCB1 in the memory cell array 1. The gate of the cell transistor Tr in each memory cell MC is supplied with the word line voltage $V_{WL}$ from the word line voltage generator 53A. The other end M1 of the serially connected cell transistors Tr is supplied with a plate line voltage $V_{aa}$, which is also applied to the cell block MCB0, MCB1.

The constant current source unit 502 includes a constant current source 502a configured to provide a constant current. The constant current source 502a has an output terminal connected to one end M2 of the cell transistors Tr serially connected in the dummy cell block 501. On the other hand, the opposite terminal of the constant current source 502a from the dummy cell block 501 is connected to the drain of a p-type MOS transistor 502b. The other end (source) of the p-type MOS transistor 502b is supplied with a supply voltage $V_{CC}$. The p-type MOS transistor 502b has a gate, which receives a signal HAN from the cell transistor resistance decision-controller 51B via an inverter 502c. The signal HAN is a starting signal for the cell transistor resistance decision-circuit 51A to decide the resistance of the cell transistors Tr. In the constant current source unit 502, the p-type MOS transistor 502b is turned on when the signal HAN is switched to "H", and a constant current flows in the constant current source 502a.

The differential amp 503 includes two p-type MOS transistors 503a, 503b having respective sources supplied with the supply voltage $V_{CC}$, and two n-type MOS transistors 503c, 503d connected to the drains of the two p-type MOS transistors 503a, 503b. The two p-type MOS transistors 503a, 503b have respective gates connected to each other, and the connection point (gate) forms a node 503e. The node 503e is connected to the drain of the p-type MOS transistor 503a. The two n-type MOS transistors 503c, 503d have respective sources connected to each other. One n-type MOS transistor 503c has a gate supplied with a voltage $V_m$ on a node between the dummy cell block 501 and the constant current source unit 502. The other n-type MOS transistor 503d has a gate supplied with the potential, $V_{aa}+\alpha$, from the reference voltage circuit 504 later described. The mutually connected sources of the n-type MOS transistors 503c, 503d are grounded via two n-type MOS transistors 503f, 503g serially connected. An output line 503i is provided on a node 503h between the p-type MOS transistor 503b and the n-type MOS transistors 503d. The output line 503i is connected to the drain of a p-type MOS transistor 503j. The p-type MOS transistor 503j has a source supplied with the supply voltage $V_{CC}$.

In the differential amp 503, the n-type MOS transistor 503f receives a signal BIAS on the gate, and the n-type MOS transistor 503g and the p-type MOS transistor 503j receive the signal HAN on the gates. The signal BIAS is a signal fed from an external circuit, which is set at a middle potential between an external voltage $V_{CC}$ and the GND potential $V_{SS}$ and used to control the operating current in the differential amp 503. The signal BIAS is a certain voltage. Thus, the differential amp 503 can start operation when the signal BIAS and the signal HAN become "H". The output signal from the differential amp 503 becomes the potential $V_{refm}$ on the node 503h.

The reference voltage circuit 504 includes two resistors 504a, 504b serially connected and having one end grounded. The reference voltage circuit 504 includes a p-type MOS transistor 504c having a drain connected to one end of the resistor 504a and a source connected to the supply voltage $V_{CC}$, and an inverter 504d connected to the gate of the p-type MOS transistor 504c. A node 504e between the resistor 504a and the resistor 504b is connected to the gate of the n-type MOS transistor 503d. The inverter 504d receives the signal HAN. When the signal HAN becomes "H", the p-type MOS transistor 504c turns on and the potential on the node 504e becomes $V_{aa}+\alpha$.

The latch 505 includes two p-type MOS transistors 505a, 505b, two n-type MOS transistors 505c, 505d serially connected thereto, an inverter 505e, and an inverter 505f connected in parallel with the inverter 505e in the opposite direction. The p-type MOS transistor 505b and the n-type MOS transistor 505c have respective gates connected to the output terminal of an inverter 505g provided on the output line 503i. The n-type MOS transistor 505d has a gate connected to an inverter 505h. The input terminal of the inverter 505h and the gate of the p-type MOS transistor 505a receive a signal HANL via an input line 505i. When the signal HANL is at "L", the output signal from the differential amp 503 is inverted and the inverted signal on the node 503h is transmitted as a signal TRIM. When the signal HANL is at "H", the p-type MOS transistor 505a and the n-type MOS transistor 505d turn off to separate the output signal from the differential amp 503 from the signal TRIM. In this case, even if the signal on the node 503h varies, the output signal TRIM can not vary and thus the previous state can be latched. The signal TRIM is turned into the input signal fed to the trimming latch 52A.

The following description is given to the basic operation in the cell transistor resistance decision-circuit 51A thus configured. First, the constant current source unit 502 supplies a current flowing in the dummy cell block 501 to create the potential $V_m$ determined from the resistance of the dummy cell block 501. Next, the differential amp 503 compares the potential $V_m$ with the potential, $V_{aa}+\alpha$, from the reference voltage circuit 504. If $V_m > V_{aa}+\alpha$, the potential $V_{refm}$ becomes "H" and accordingly the signal TRIM output through the latch 505 becomes "L". Namely, the resistance of the cell block MCB0, MCB1 in the memory cell array 1 is determined higher than a certain value and the word line voltage is boosted. In contrast, if $V_m < V_{aa}+\alpha$, the signal TRIM becomes "H". Namely, the resistance of the cell block MCB0, MCB1 in the memory cell array 1 is determined lower than a certain value and the word line voltage is lowered.

The latch 505 transmits signal $V_{refm}$ to the signal TRIM while the signal HANL from the trimming controller 52B is kept at "L". It latches the signal TRIM when the signal HANL becomes "H" and fixes TRIM even if $V_{refm}$ varies.

Figure 4:
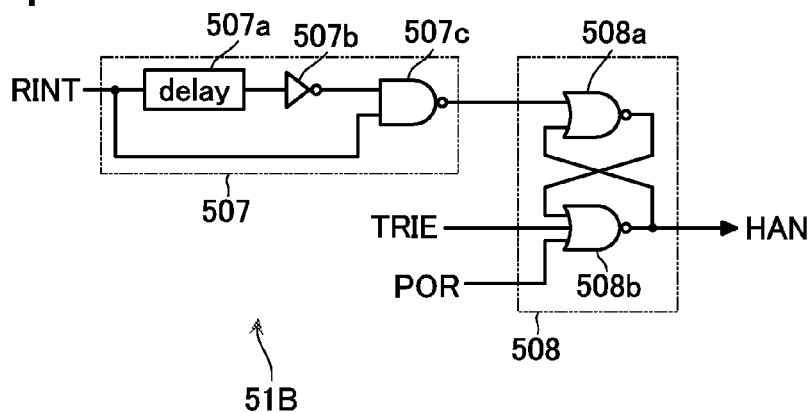
FIG. 4 is a brief block diagram of a cell transistor resistance decision-controller 51B in the FeRAM according to the embodiment of the present invention.

Referring next to FIG. 4, the cell transistor resistance decision-controller 51B is described. As shown in FIG. 4, the cell transistor resistance decision-controller 51B includes a signal generator 507 operative to generate the signal HAN, and a latch 508 operative to latch the signal HAN.

The signal generator 507 includes a delay circuit 507a, an inverter 507b, and a NAND circuit 507c, all serially connected. The delay circuit 507a has an input terminal used to receive a signal RINT. The signal RINT is a signal input from external, which becomes "H" when an internal voltage is stabilized. The NAND circuit 507c receives an output signal from the inverter 507b and the signal RINT.

The latch 508 includes two NOR circuits 508a and 508b. The NOR circuit 508a has one input terminal used to receive the output signal from the NAND circuit 507c and the output signal from the NOR circuit 508b. The NOR circuit 508b has input terminals used to receive the output signal from the NOR circuit 508a and signals TRIE and POR. The latch 508 provides the signal HAN to external. The signal TRIE is generated at the timing controller 52C and used to terminate the decision of the resistance of the cell transistors Tr and the adjustment of the word line voltage based on the result. The signal POR is a power-on reset signal output from a power-on reset circuit (not shown) operative to sense power-on, which signal becomes "H" for a certain time at the time of power-on.

The cell transistor resistance decision-controller 51B thus configured latches the signal HAN that becomes a pulse of "H" when the signal RINT becomes "H", and provides the latched signal to external.

Figure 5:
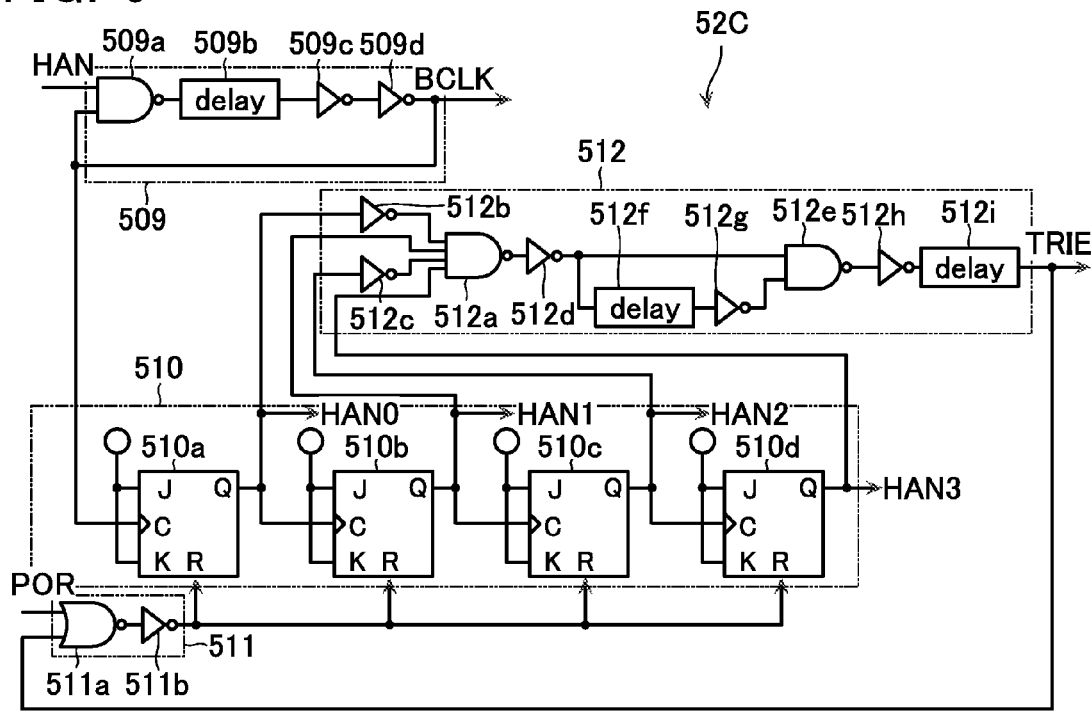
FIG. 5 is a brief block diagram of a timing controller 52C in the FeRAM according to the embodiment of the present invention.

The circuitry of the timing controller 52C is described next with reference to FIG. 5. As shown in FIG. 5, the timing controller 52C includes an oscillator 509, a counter 510, a reset circuit 511, and a pulse generator 512.

The oscillator 509 provides a signal BCLK based on the input signal HAN. The signal BCLK is a signal used to activate the trimming controller 52B. The counter 510 provides signals HAN0-HAN3 based on the signal BCLK. The reset circuit 511 resets the count in the counter 510. The pulse generator 512 provides the signal TRIE based on the signals HAN0-HAN3. The signals HAN0-HAN3 are signals used to generate the signals TRIE, HANL and so forth.

The oscillator 509 includes a NAND circuit 509a, a delay circuit 509b, and two inverters 509c, 509d, all serially connected. The NAND circuit 509a has input terminals, which receive the signal HAN and the output signal from the inverter 509d.

The counter 510 includes four J-K flip-flops 510a-510d. Each J-K flip-flop 510a-510d has input terminals J and K, which are mutually connected and supplied with an identical signal. The J-K flip-flop 510a has an input terminal C that receives the signal BCKL from the oscillator 509. The J-K flip-flops 510b-510d have respective input terminals C, which receive the signals HAN0-HAN2 from the output terminals Q of the J-K flip-flops 510a-510c. The signals HAN0-HAN3 from the output terminals Q of the J-K flip-flops 510a-510d are provided to the pulse generator 512.

The reset circuit 511 includes a NOR circuit 511a and an inverter 511b serially connected. The NOR circuit 511a receives the signal POR and the signal TRIE. The inverter 511b provides an output signal, which is received by the J-K flip-flops 510a-510d at the reset terminals R.

The pulse generator 512 includes a NAND circuit 512a, which receives the signals HAN0-HAN3. Inverters 512b and 512c are interposed in input lines that lead the signals HAN0 and HAN2 to the NAND circuit 512a. An NAND circuit 512e is provided on the output side of the NAND circuit 512a with an inverter 512d interposed therebetween. A delay circuit 512f and an inverter 512g serially connected are provided between another input terminal of the NAND circuit 512e and the inverter 512d. An inverter 512h and a delay circuit 512i serially connected are provided on the output side of the NAND circuit 512e.

The timing controller 52C thus configured generates the clock signal BCLK at a period of, for example, 200 ns from the oscillator 509 based on the signal HAN. The counter 510 creates the signals HAN0-HAN3 serving as the clock. The pulse generator 512 generates the signal TRIE used to terminate adjustment of the word line voltage based on the signals HAN0-HAN3. The signal TRIE is generated during a certain period of time (for example, 20 ns) after the elapse of a certain time (for example, after 25 ns) from the timing when the signals HAN0-HAN3 from the counter 510 becomes to satisfy a certain condition.

Figure 6:
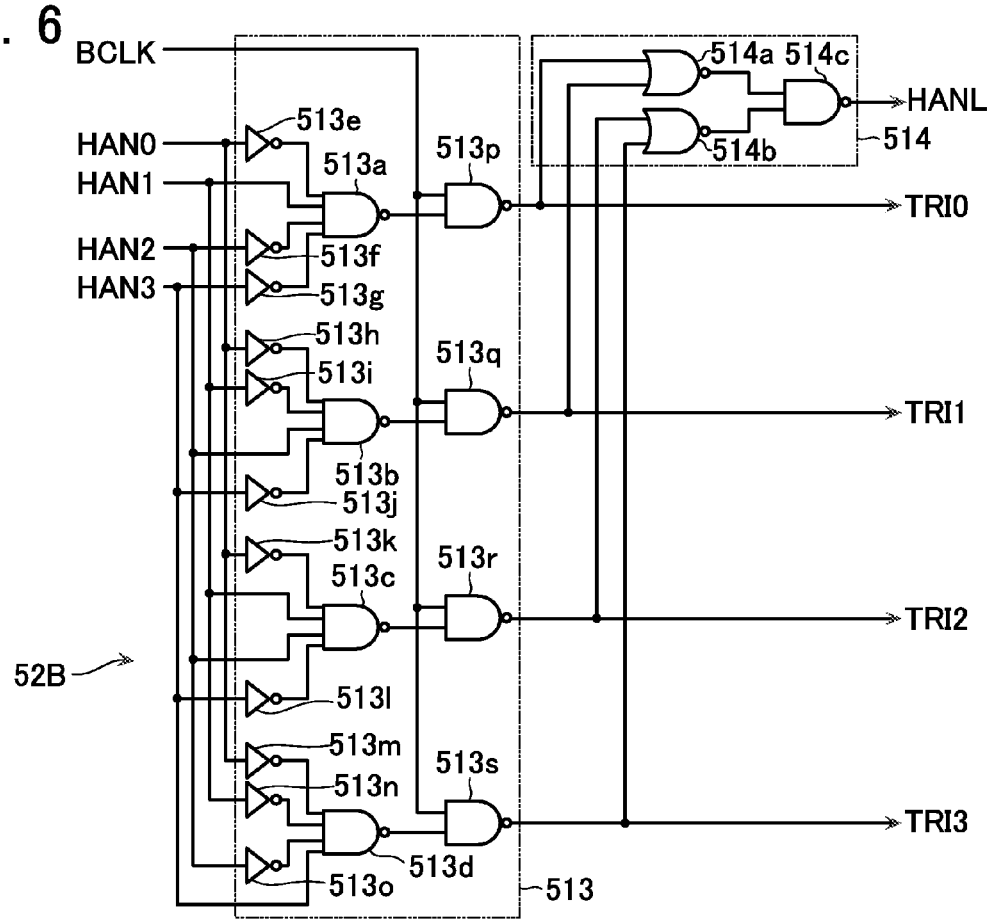
FIG. 6 is a brief block diagram of a trimming controller 52B in the FeRAM according to the embodiment of the present invention.

The circuitry of the trimming controller 52B is described next in detail with reference to FIG. 6. The trimming controller 52B includes a trimming signal generator 513 and a logic circuit 514 as shown in FIG. 6.

The trimming signal generator 513 receives the input of the signals HAN0-HAN3 and provides signals TRI0-TRI3 used to control the trimming latch 52A. The logic circuit 514 generates the signal HANL that becomes "H" at the timing of latch operation in the cell transistor resistance decision-circuit 51A.

The trimming signal generator 513 includes four NAND circuits 513a-513d, inverters 513e-513o, and NAND circuits 513p-513s.

The four NAND circuits 513a-513d receive the signals HAN0-HAN3 or the inverted signals thereof. The inverters 513e-513o are provided on the input side of the NAND circuits 513a-513d. The NAND circuits 513p-513s receive the output signals from the NAND circuits 513a-513d and the output signal BCLK from the timing controller 52C. The NAND circuits 513p-513s pass the signals TRI0-TRI3 therethrough.

The logic circuit 514 includes two NOR circuits 514a, 514b and a NAND circuit 514c.

The NOR circuit 514a receives the output signals from the NAND circuit 513p and the NAND circuit 513q. The NOR circuit 514b receives the output signals from the NAND circuit 513r and the NAND circuit 513s. The NAND circuit 514c receives the output signals from the NOR circuit 514a and the NOR circuit 514b.

The trimming controller 52B thus configured generates the signals TRI0-TRI3 at the trimming signal generator 513 based on the signals HAN0-HAN3 output from the counter 510 and the signal BCLK. From the logic circuit 514, the signal HANL, which becomes "H" at the output timing of the signals HAN0-HAN3, is provided to the cell transistor resistance decision-circuit 51A to latch the signal TRIM.

Figure 7:
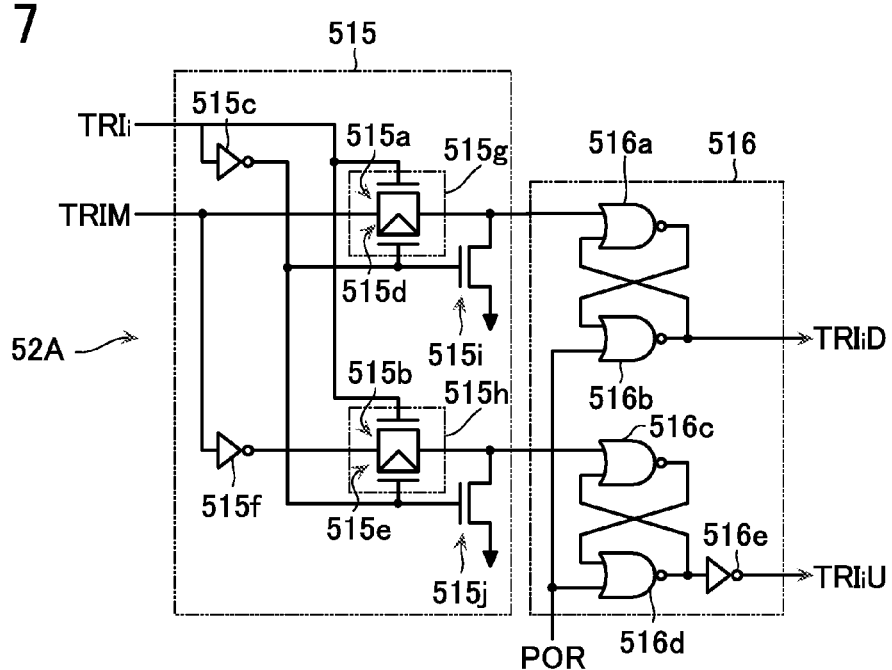
FIG. 7 is a brief block diagram of a trimming latch 52A in the FeRAM according to the embodiment of the present invention.

Referring next to FIG. 7, the circuitry of the trimming latch 52A is described in detail. As shown in FIG. 7, the trimming latch 52A includes a transfer circuit 515 operative to receive the signal TRIM and the signals TRI0-TRI3 and transfer the signal TRIM therethrough when the signals TRI0-TRI3 are at "H". It also includes a latch 516 operative to latch the signal output from the transfer circuit 515.

The transfer circuit 515 includes two n-type MOS transistors 515a, 515b, an inverter 515c, two p-type MOS transistors 515d, 515e, an inverter 515f, and two more n-type MOS transistors 515i, 515j.

The two n-type MOS transistors 515a, 515b have respective drains, which receive the signals TRI0-TRI3. The inverter 515c inverts the signals TRI0-TRI3 and provides the inverted signals to the two p-type MOS transistors 515d, 515e. The n-type MOS transistors 515a, 515b and the p-type MOS transistors 515d, 515e have mutually connected drains and sources to form transfer gates 515g, 515h.

The n-type MOS transistors 515a, 515b contained in the transfer gates 515g, 515h have respective gates, which receive the signal TRIi. The p-type MOS transistors 515d, 515e contained in the transfer gates 515g, 515h have respective gates, which receive the signal TRIi (i=0-3) via the inverter 515c.

The transfer gate 515g receives the signal TRIM at one end, which is fed to external from the other end of the transfer gate 515g. The transfer gate 515h receives the inverted signal/TRIM of the signal TRIM via the inverter 515f at one end, which is fed to external from the other end of the transfer gate 515h.

The n-type MOS transistor 515i has a source grounded and a drain connected to the output of the transfer gate 515g. The n-type MOS transistor 515i has a gate, which receives the output signal from the inverter 515c. Similarly, the n-type MOS transistor 515j has a source grounded and a drain connected to the output of the transfer gate 515h. The n-type MOS transistor 515j has a gate, which receives the output signal from the inverter 515c.

The latch 516 includes four NOR circuits 516a-516d, and an inverter 516e. The NOR circuit 516a has input terminals, which receive the signal TRIM passed through the transfer gate 515 and the output signal from the NOR circuit 516b. The NOR circuit 516b has input terminals, which receive the signal POR and the output signal from the NOR circuit 516a. The NOR circuit 516c has input terminals, which receive the signal/TRIM passed through the transfer gate 515 via the inverter 515f and the output signal from the NOR circuit 516d. The NOR circuit 516d has input terminals, which receive the signal POR and the output signal from the NOR circuit 516c.

The NOR circuit 516b provides a signal TRIiD (i=0-3). An inverter 516e is provided on the output side of the NOR circuit 516d, which provides a signal TRIiU (i=0-3) via the inverter 516e.

The trimming latch 52A thus configured resets the latch 516 in response to the input of the signal POR and initializes the signal TRIiD (i=0-3) to "L" and the signal TRIiU (i=0-3) to "H". The transfer gate 515 transfers the signal TRIM to the latch 516 when the signal TRIi is at "H". The transfer gate 515 holds the signal TRIiD still at "L" and switches the signal TRIiU from "H" to "L" when the signal TRIM is at "L". The trimming latch 52A switches the signal TRIiD from "L" to "H" and holds the signal TRIiU at "H" when the signal TRIM is at "H".

Figure 8:
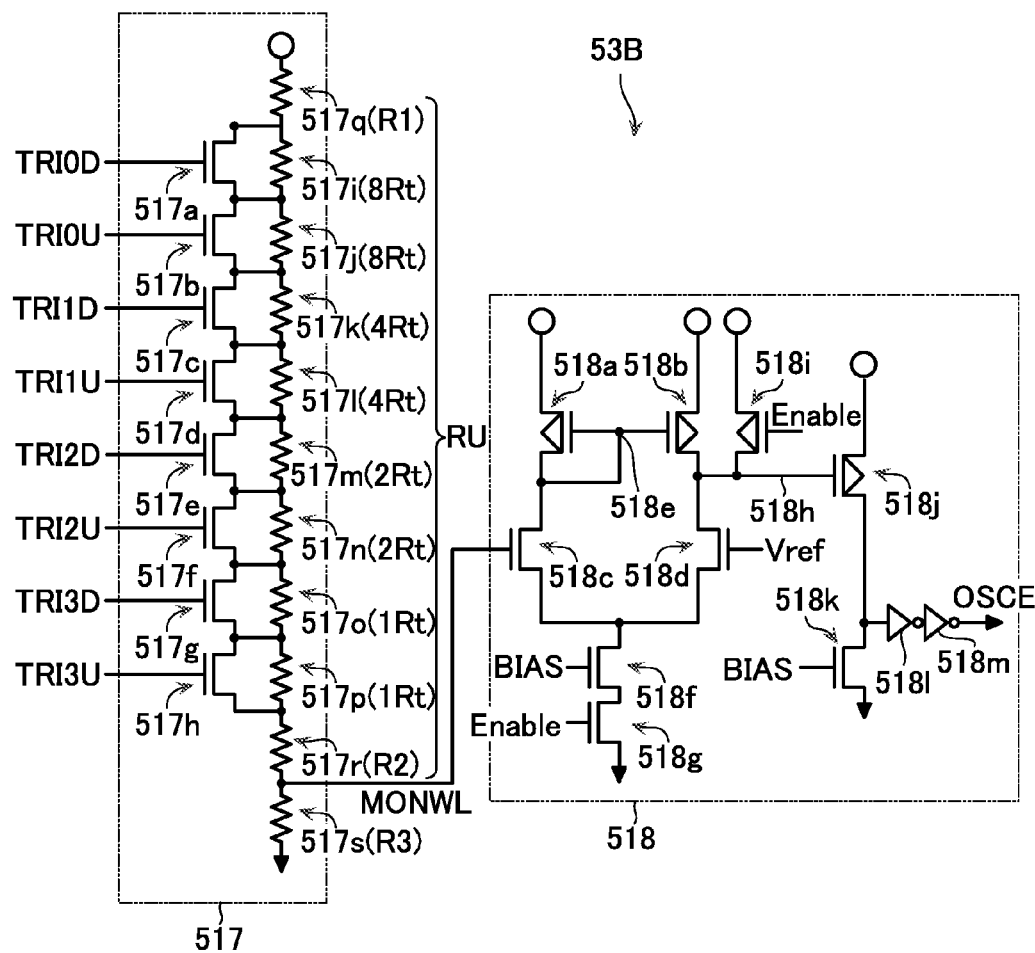
FIG. 8 is a brief block diagram of a word line voltage controller 53B in the FeRAM according to the embodiment of the present invention.

Referring next to FIG. 8, the circuitry of the word line controller 53B is described in detail. The word line controller 53B includes a resistor train 517 having a plurality of serially connected resistors, and a differential amp 518.

The resistor train 517 includes transistors 517a-517h, resistors 517i-517p connected between sources and drains of the transistors 517a-517h, a resistor 517q connected serially to the resistor 517i, and resistors 517r, 517s connected serially to the resistor 517$p$. The resistors 517$i$-517$p$ have four types of resistances 8Rt, 4Rt, 2Rt, 1Rt. The resistors 517$q$, 517$r$, 517$s$ have resistances R1, R2, R3. The transistors 517$a$-517$h$ have respective gates, which receive signals TRI0D, TRI0U, ..., TRI3D, TRI3U. The potential on a node between the resistor 517$r$ and the resistor 517$s$ is provided to external as a signal MONWL.

The differential amp 518 includes two p-type MOS transistors 518$a$, 518$b$ having respective sources supplied with the supply voltage $V_{CC}$, and two n-type MOS transistors 518$c$, 518$d$ connected to the drains of the two p-type MOS transistors 518$a$, 518$b$. The two p-type MOS transistors 518$a$, 518$b$ have respective gates mutually connected and the connection point (gate) forms a node 518$e$. The node 518$e$ is connected to the drain of the p-type MOS transistor 518$a$. The two n-type MOS transistors 518$c$, 518$d$ have respective sources mutually connected. One n-type MOS transistor 518$c$ has a gate, which receives the signal MONWL. The other n-type MOS transistor 518$d$ has a gate, which receives the reference signal $V_{ref}$. The mutually connected sources of the n-type MOS transistors 518$c$, 518$d$ are grounded via two serially connected n-type MOS transistors 518$f$, 518$g$. The p-type MOS transistor 518$b$ has a drain connected to an output line 518$h$. The output line 518$h$ is connected to the drain of the p-type MOS transistor 518$i$ and the gate of the p-type MOS transistor 518$j$. The p-type MOS transistor 518$j$ has a drain connected to the drain of the n-type MOS transistor 518$k$ and two serially connected inverters 518$l$, 518$m$.

The n-type MOS transistors 518$f$, 518$g$, 518$d$, 518$i$, 518$k$ have respective gates, which receive signals BIAS, $E_{nable}$, $V_{ref}$, $E_{nable}$, BIAS. The signal BIAS and the signal $E_{nable}$ are signals fed from external. The signal $V_{ref}$ is a reference potential for use in comparison of the signal MONWL. The signal $E_{nable}$ is a signal used to start operation of the differential amp 518 together with the signal BIAS.

The inverter 518$m$ provides a signal OSCE. The signal OSCE is used to create the signal $V_{WL}$ at the word line generator 53A.

The word line controller 53B thus configured creates the signal MONWL at the resistors 517$i$-517$s$ in the resistor train 517 for use in adjustment of the potential of the signal VWL. The differential amp 518 compares the signal MONWL with the internal reference voltage $V_{ref}$ to provide the signal OSCE. The word line generator 53A operates when the signal OSCE is at "H". The word line generator 53A halts when the signal OSCE is at "L".

The configuration of the word line controller 53B is described below in detail. In the initial state, the latch 516 sets the signal TRIiD (i=0-3) at "L" and the signal TRIiU (i=0-3) at "H" as described above. Therefore, the synthesized resistance RU in the resistor train 517 is represented by RU=R1+8Rt+2Rt+1Rt+R2, which determines the potential of the signal MONWL in the initial state. The synthesized resistance RU varies in accordance with the decision resulted from the cell transistor resistance decision-circuit 51A. When the signal TRIM is at "L", the signals TRIiD and TRIiU both become "L" and the TRIiU-related n-type MOS transistors 517$b$, 517$d$, 517$f$, 517$h$ in the resistor train 517 turn off to increase the synthesized resistance RU. When the signal TRIM is at "H" in contrast, the signals TRIiD and TRIiU both become "H" and the TRIiD-related n-type MOS transistors 517$a$, 517$c$, 517$e$, 517$g$ turn on to decrease the synthesized resistance RU. In this way, the word line voltage controller 53B executes the trimming of the word line voltage.

Figure 9:
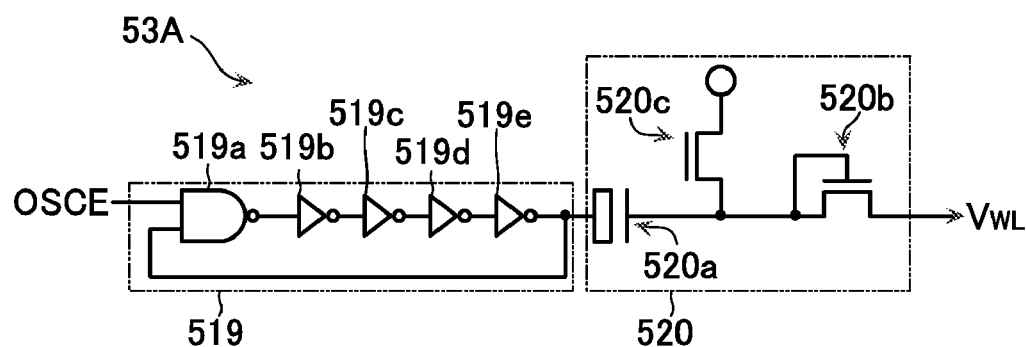
FIG. 9 is a brief block diagram of a word line voltage generator 53A in the FeRAM according to the embodiment of the present invention.

Referring next to FIG. 9, the circuitry of the word line voltage generator 53A is described in detail. The word line voltage generator 53A includes a ring oscillator 519 and a charge pump 520 as shown in FIG. 9.

The ring oscillator 519 includes a NAND circuit 519$a$ and four inverters 519$b$-519$e$, all serially connected. The NAND circuit 519$a$ receives the signal OSCE and the output signal from the inverter 519$e$.

The charge pump 520 includes a capacitor 520$a$, a diode-connected n-type MOS transistor 520$b$, and an n-type MOS transistor 520$c$ having a source connected to a node between the capacitor 520$a$ and the n-type MOS transistor 520$b$.

The word line voltage generator 53A thus configured provides a signal from the ring oscillator 519 at a certain timing when the signal OSCE is at "H". The word line voltage generator 53A provides the boosted voltage $V_{WL}$ from the charge pump 520.

The operating waveforms of the major signals are described next with reference to FIG. 10.

The signal RINT indicates that the inside of the circuit is stabilized after power-on as described above. After the voltage on the internal circuit is stabilized, the signal HAN becomes "H", which is used to start the decision of the resistance of the cell transistors Tr and the adjustment of the word line voltage.

The decision of the resistance of the cell transistors and the adjustment of the word line voltage in the present embodiment include internally generating the clock signal, driving the counter 510 in accordance with the basic clock, and sequentially executing the decision of the resistance of the cell transistors and the adjustment of the word line voltage.

As described above, the signal BCLK is the basic clock, and the signals HAN0-HAN3 are the output signals created at the counter 510. The signals TRI0-TRI3 are the signals used to determine the timing for the trimming latch 52A to execute trimming in accordance with the output from the cell transistor resistance decision-circuit 51A.

Figure 10:
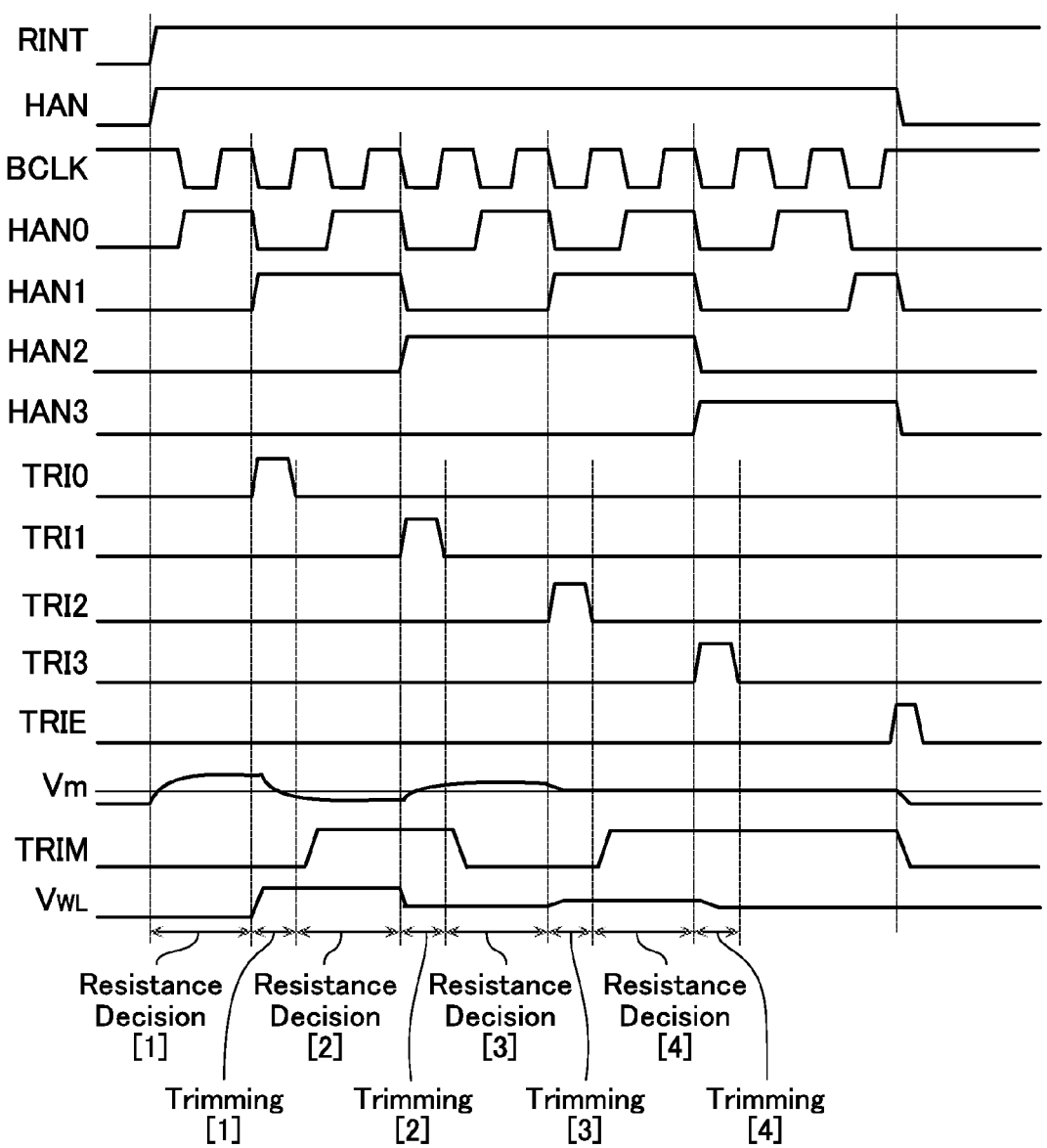
FIG. 10 is a timing chart showing operation of the FeRAM according to the embodiment of the present invention.

As shown in FIG. 10, the decision of the resistance of the cell transistors Tr is started after the signal HAN becomes "H", and trimming is executed while the signal TRIi (i=0-3) is at "H". The period until TRI0 becomes "H" after the signal HAN rises is a period for a first decision of the resistance of the cell transistors Tr (Resistance Decision [1]). The period during the signal TRI0 at "H" is a period for a first trimming by the word line voltage controller 53B (Trimming [1]). Similarly, the period until TRI1 becomes "H" is Resistance Decision [2] and the period during the signal TRI1 at "H" is Trimming [2]. Yet similarly, the period until TRI3 becomes "H" is Resistance Decision [3] and the period during the signal TRI3 at "H" is Trimming [3]. Still similarly, the period until TRI4 becomes "H" is Resistance Decision [4] and the period during the signal TRI4 at "H" is Trimming [4]. The FeRAM according to the embodiment of the present invention executes the measurement of the resistance of the cell transistors Tr and the trimming of the word line voltage based on the measurement result, repeatedly four times.

For example, with the trimming width of ±0.125V×8 (the number of steps)=±1 V at the first time, of ±0.125V×4 (the number of steps)=±0.5 V at the second time, of ±0.125V×2 (the number of steps)=±0.25 V at the third time, and of ±0.125V×1 (the number of steps)=±0.125 V at the fourth time, trimming is repeated four times to finely adjust the voltage.

As shown in FIG. 10, in the first and third resistance decisions [1], [3], the resistance is decided higher ($V_m > V_{refm}$ and TRIM=L) and an adjustment is executed to elevate the word line voltage. In the second and fourth resistance decisions [2], [4], the resistance is decided lower ($V_m < V_{refm}$ and TRIM=H) and an adjustment is executed to lower the word line voltage.

If the initialized voltage is 3.2V, the potential $V_m$ is adjusted in this case from the initial voltage 3.2V to 0.0625V higher one, as in 3.2V+0.1V−0.5V+0.25V−0.125V=3.2625V.

The FeRAM according to the embodiment of the present invention is provided with the function of adjusting the word line voltage in accordance with the resistance of the cell transistors Tr as described above. The resistance of the cell transistors Tr is measured after the supply voltage inside the circuit is stabilized. If the resistance of the cell transistors Tr is decided higher as a result of the measurement, the gate potential on the cell transistor Tr or the word line voltage is adjusted high to adjust the word line voltage such that the resistance of the cell transistors Tr lowers. On the other, if the resistance of the cell transistors Tr is decided lower, the gate potential on the cell transistor Tr or the word line voltage is adjusted low to adjust the word line voltage such that the resistance of the cell transistors Tr arises.

The FeRAM according to the embodiment of the present invention can retain the sense margin even if the resistance of the cell transistors Tr varies greatly. The FeRAM according to the embodiment of the present invention can vary the word line voltage until a constant sense margin can be achieved even if the resistance of the cell transistors Tr varies little.

The FeRAM according to the embodiment of the present invention can execute sensing before the cell node reaches a certain level without causing any malfunction. It also can suppress power consumption in the word line voltage generator.

The FeRAM according to the embodiment executes the decision of the resistance of the cell transistors Tr and the adjustment of the word line voltage four times repeatedly while the internal power supply is stabilized after power-on. For example, the range for adjustment of the word line voltage may be assumed to extend from 3.0125V to 3.3875V with 3.2V in the initialized state. In this case, adjustments can be achieved in 30 steps of 0.375V. Namely, adjustments can be achieved 8 steps by a first decision and voltage elevating adjustment, 4 steps by a second decision and voltage elevating adjustment, 2 steps by a third decision and voltage elevating adjustment, and one step by a fourth decision and voltage elevating adjustment. Therefore, as in the above-described example, the voltage can be adjusted finely in steps of 0.125V.

In accordance with the embodiment of the present invention, the word line voltage is adjusted such that the cell resistance reaches a predetermined value. This adjustment makes it possible to eliminate the lack of a sense margin and improve the chip yield. The conventional method of trimming in accordance with the result from the performance test on a chip basis requires test time and trimming time. Accordingly, it is difficult to respond to each chip in practice because of excessively required cost and time. To the contrary, in the present embodiment, the FeRAM itself has a self-deciding function, which can be used to set an optimal voltage by the chip itself. Therefore, it requires no cost for test time and trimming time.

The embodiments of the invention have been described above though the present invention is not limited to the above embodiments but rather can be given various modifications, additions, replacements and so forth without departing from the scope and spirit of the invention.

For example, in the above embodiment, the decision reference to the resistance of the cell transistors Tr is a single reference potential $V_{refm}$ though two reference potentials $V_{refmu}$, $V_{refmd}$ may be used. In such the case, if the monitor voltage $V_m$ on the cell transistors Tr is higher than one reference potential $V_{refmu}$, the word line potential is adjusted high. In contrast, the monitor potential $V_m$ is lower than the other reference potential $V_{refmd}$, the word line potential is adjusted low. Namely, if the monitor voltage $V_m$ is lower than the reference potential $V_{refm}$ or higher than the reference potential $V_{refmd}$, the word line voltage is retained as it is. Such the decision and adjustment may be repeated plural times, for example, four times to adjust the word line voltage to a value with regard to the resistance of the cell transistors Tr.

The reference potentials are not limited to two types but three of more reference potentials may be used in decision.

What is claimed is:

1. A ferroelectric memory, comprising:
   a memory cell block of plural serially connected memory cells each including a cell transistor and a ferroelectric capacitor connected in parallel therewith;
   a cell transistor resistance measuring circuit configured to measure a resistance of the cell transistor;
   a word line voltage controller configured to control a word line voltage applied to a gate of the cell transistor based on the resistance of the cell transistor; and
   a word line voltage generator configured to generate the word line voltage.

2. The ferroelectric memory according to claim 1, wherein the word line voltage controller stores at a first time a signal associated with the resistance of the cell transistor measured in the cell transistor resistance measuring circuit, and adjusts the word line voltage at a second time after the first time.

3. The ferroelectric memory according to claim 1, wherein the cell transistor resistance measuring circuit measures the resistance of the cell transistor plural times repeatedly,
   wherein the word line voltage controller adjusts the word line voltage plural times repeatedly.

4. The ferroelectric memory according to claim 1, wherein the cell transistor resistance measuring circuit adjusts the word line voltage based on a reference potential.

5. The ferroelectric memory according to claim 1, wherein the cell transistor resistance measuring circuit adjusts the word line voltage based on plural reference potentials.

6. The ferroelectric memory according to claim 1, wherein the cell transistor resistance measuring circuit includes a dummy cell block identical to the memory cell block, and measures the resistance of the cell transistor in the dummy cell block.

7. The ferroelectric memory according to claim 1, wherein the cell transistor resistance measuring circuit starts measurement of the resistance of the cell transistor after an internal voltage is stabilized.

8. The ferroelectric memory according to claim 1, wherein the word line voltage controller raises the word line voltage if the resistance of the cell transistor is determined higher than a certain threshold, and lowers the word line voltage if the resistance of the cell transistor is determined lower than a certain threshold.

9. The ferroelectric memory according to claim 1, wherein the word line voltage generator includes
   a resistor train of plural serially connected units each including a transistor and a resistor connected in parallel therewith and arranged to receive a control signal from the word line voltage controller on the gate of the transistor, and
   a differential amp configured to compare an inner reference voltage with an output signal associated with a synthesized resistance of the resistor train.

10. The ferroelectric memory according to claim 9, wherein the word line voltage generator includes
    a ring oscillator configured to provide a signal to external at a certain timing if it determines that an output signal from the differential amp is at a high level, and a charge pump configured to generate a boosted voltage based on an output signal from the ring oscillator.

11. The ferroelectric memory according to claim 8, wherein the word line voltage controller stores at a first time a signal associated with the resistance of the cell transistor measured in the cell transistor resistance measuring circuit, and adjusts the word line voltage at a second time after the first time.

12. The ferroelectric memory according to claim 8, wherein the cell transistor resistance measuring circuit measures the resistance plural times repeatedly,
wherein the word line voltage controller adjusts the word line voltage plural times repeatedly.

13. The ferroelectric memory according to claim 8, wherein the cell transistor resistance measuring circuit adjusts the word line voltage based on a reference potential.

14. The ferroelectric memory according to claim 8, wherein the cell transistor resistance measuring circuit adjusts the word line voltage based on plural reference potentials.

15. The ferroelectric memory according to claim 8, wherein the cell transistor resistance measuring circuit includes a dummy cell block identical to the memory cell block, and measures the resistance of the cell transistor in the dummy cell block.

16. The ferroelectric memory according to claim 8, wherein the cell transistor resistance measuring circuit starts measurement of the resistance of the cell transistor after an internal voltage is stabilized.

* * * * *